(12) United States Patent
Halliyal et al.

(10) Patent No.: US 7,786,003 B1
(45) Date of Patent: Aug. 31, 2010

(54) BURIED SILICIDE LOCAL INTERCONNECT WITH SIDEWALL SPACERS AND METHOD FOR MAKING THE SAME

(75) Inventors: Arvind Halliyal, Cupertino, CA (US); Zoran Krivokapic, Santa Clara, CA (US); Matthew S. Buynoski, Palo Alto, CA (US); Nicholas H. Tripsas, San Jose, CA (US); Minh Van Ngo, Fremont, CA (US); Mark T. Ramsbey, Sunnyvale, CA (US); Jeffery A. Shields, Sunnyvale, CA (US); Jusuke Ogura, Tokyo (JP)

(73) Assignees: Advanced Micro Devices, Inc., Sunnyvale, CA (US); Spansion LLC, Sunnyvale, CA (US)

( * ) Notice: Subject to any disclaimer, the term of this patent is extended or adjusted under 35 U.S.C. 154(b) by 372 days.

(21) Appl. No.: 11/136,569

(22) Filed: May 25, 2005

(51) Int. Cl.
*H01L 21/4763* (2006.01)
(52) U.S. Cl. .................................... 438/630
(58) Field of Classification Search ................ 438/425, 438/630; 257/E21.199
See application file for complete search history.

(56) References Cited

U.S. PATENT DOCUMENTS

| 4,962,414 A | * | 10/1990 | Liou et al. | 257/740 |
| 5,162,259 A | * | 11/1992 | Kolar et al. | 438/642 |
| 6,261,908 B1 | | 7/2001 | Hause et al. | |
| 2004/0038517 A1 | * | 2/2004 | Kang et al. | 438/630 |
| 2005/0112831 A1 | * | 5/2005 | Surdeanu | 438/301 |

* cited by examiner

*Primary Examiner*—Asok K Sarkar
(74) *Attorney, Agent, or Firm*—Volpe and Koenig, P.C.

(57) ABSTRACT

A buried local interconnect and method of forming the same counterdopes a region of a doped substrate to form a counterdoped isolation region. A hardmask is formed and patterned on the doped substrate, with a recess being etched through the patterned hardmask into the counterdoped region. Dielectric spacers are formed on the sidewalls of the recess, with a portion of the bottom of the recess being exposed. A metal is then deposited in the recess and reacted to form silicide at the bottom of the recess. The recess is filled with fill material, which is polished. The hardmask is then removed to form a silicide buried local interconnect.

11 Claims, 3 Drawing Sheets

BURIED SILICIDE LOCAL INTERCONNECT WITH SIDEWALL SPACERS AND METHOD FOR MAKING THE SAME

FIELD OF THE INVENTION

The present invention relates to the field of semiconductor device manufacture, and more particularly, to the fabrication of a buried local interconnect for semiconductor devices.

BACKGROUND OF THE INVENTION

Modern integrated circuits routinely contain millions of individual transistors and other electronic components. Most of the interconnections are provided via one or more metallization layers that serve as global interconnect levels. Each metallization layer is ordinarily deposited on a substrate of the integrated circuit as a single continuous layer that is thereafter patterned lithographically and etched to remove metal from areas where metal lines are not required.

In addition to the one or more metallization layers, modern integrated circuits also incorporate numerous routing restricted interconnect levels commonly known as local interconnects ("LI"). LIs are used for short conductor runs such as those that locally interconnect gates and drains in NMOS and CMOS circuits and those that connect a given metallization layer to a particular structure in the integrated circuit.

A conventional method frequently employed to form LI structures involves a damascene process in which the substrate containing the integrated circuit is coated with a layer of dielectric material, such as a silicon dioxide layer. The passivation layer is lithographically patterned and etched to form trenches where the LI structures will be deposited. In another conventional processing technique, local interconnects are formed on the substrate prior to application of a passivation layer. A feature common to both conventional techniques is the deposition of the local interconnect layers at or above the silicon-silicon dioxide interface.

As with many other modern semiconductor processing techniques, there are tradeoffs associated with implementing local interconnect layers. LI's provide a vital tool for VLSI and ULSI circuit designers. The ability to pattern a plurality of short conductor runs has enabled designers to save significant chip-area in integrated circuit layouts.

The problem of routing restriction arises when doped polysilicon is used as the local interconnect material. Doped polysilicon is often selected for local interconnect layers as a result of thermal budgeting or other design considerations. The polysilicon is commonly used as both a gate material and a local interconnect material. As a result, when the polysilicon layer functions as an interconnect structure, it cannot cross over regions where a transistor gate exists without making contact to the gate. Unless such contacts with the gate are desired, gate locations represents areas on the substrate that cannot be crossed by polysilicon layers where these layers are being used as local interconnect layers.

Various techniques to overcome the polysilicon routing restrictions have been implemented in the past. Some of these include selectively forming $TiSi_2$ to form a LI level, sputter-depositing titanium-tungsten over $CoSi_2$ contacts, forming a titanium nitride layer over a $TiSi_2$ contact, and forming a dual-doped polysilicon LI with diffused source/drain junctions. While these techniques can alleviate some of the routing difficulties associated with polysilicon local interconnect layers, they also increase processing steps and complexity. Furthermore, cluttering of the substrate area above the silicon-silicon dioxide interface remains a problem.

SUMMARY OF THE INVENTION

There is a need for a reduction in the size of buried local interconnects, allowing a shrinking of the cell size.

These and other needs are met by embodiments of the present invention that provide a method of forming a buried local interconnect comprising the steps of etching a recess having a bottom and sidewalls into a substrate, and forming sidewall spacers in the recess. Silicide is then formed on the bottom of the recess and fill material is deposited over the silicide.

By creating sidewall spacers in the recess, a silicide local interconnect line formed at the bottom of the recess may be a smaller dimension than achievable by lithographic and etching techniques. This allows further scaling down of the local interconnect and the shrinking of the cell size, as well as producing a buried local interconnect providing more chip area.

The earlier stated needs are also met by embodiments of the present invention that provide a method of forming a buried local interconnect comprising the steps of counterdoping a region of a doped substrate to form a counterdoped isolation region. A hardmask is formed and patterned on the doped substrate. A recess is etched through the patterned hardmask into the counterdoped region. Dielectric spacers are formed on the sidewalls of the recess, with the bottom of the recess being exposed. A metal is deposited in the recess and the metal in the recess is reacted to form silicide at the bottom of the recess. The recess is then filled with fill material and the hardmask is removed.

The earlier stated needs are also met by another aspect of the present invention which provides a buried local interconnect arrangement comprising a substrate, a recess in the substrate and dielectric spacers in the recess. A silicide line is at the bottom of the recess and fill material fills the recess on the silicide line and between the dielectric spacers.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to buried local interconnects. In particular, the present invention reduces the cluttering of the substrate area above a silicon-silicon dioxide interface, and reduces the size of the buried local interconnect to accommodate shrinking cell dimensions. This is achieved, in part, by the present invention etching a recess having a bottom and sidewalls into a substrate, and forming sidewall spacers in the recess. The sidewall spacers limit the size of the silicide that is subsequently formed on the bottom of the recess. Metal is deposited in the recess between the sidewall spacers and on the bottom of the recess. An annealing step is performed to react the metal with the substrate and form the silicide local interconnect at the bottom of the recess. Fill material is then deposited over the silicide to form a buried local interconnect.

In the following description, it is assumed that conventional deposition and etching methods are employed to deposit and etch the various layers and structures described. Future developed methods of depositing and etching may also be employed to form the various structures illustrated in the accompanying figures. Hence, particular deposition and etching techniques that can be employed in the present invention will not be described in detail so as not to obscure the present invention.

Figure 1:
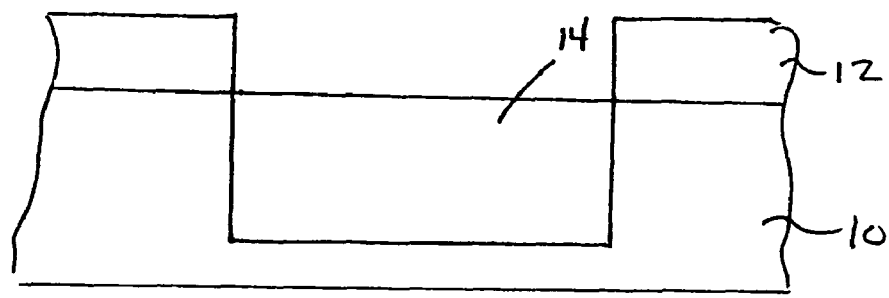
FIG. 1 is a schematic cross-sectional depiction of a portion of a local interconnect arrangement during one phase of the formation of the buried local interconnect in accordance with embodiments of the present invention.

FIG. 1 shows a cross-section of a portion of a semiconductor wafer during one step of the formation of a silicide buried local interconnect in accordance with embodiments of the present invention. A doped substrate 10 is provided in which a counterdoped region 14 is formed. The doped substrate 10 may be N-doped or P-doped, for example. The counterdoped region 14 is doped with the opposite conductivity type dopants compared to the dopants in the doped substrate 10. For example, if the doped substrate 10 is an N-type doped substrate 10, the counterdoped region 14 will be doped with P-type dopants. The counterdoping in the region 14 serves to isolate this region from the remaining portion of the doped substrate 10. The counterdoping is achieved by conventional doping techniques, such as ion implantation, employing a photoresist mask 12 that has been patterned appropriately. As will be appreciated, the dimensions (width and depth) of the counterdoped region 14 should be great enough to completely surround the subsequently formed recess so as to provide for secure isolation of the buried local interconnect. This is readily accomplished by one of ordinary skill in the art by employing suitable implantation energies to achieve a desired implantation profile of the counterdoped region 14.

Figure 2:
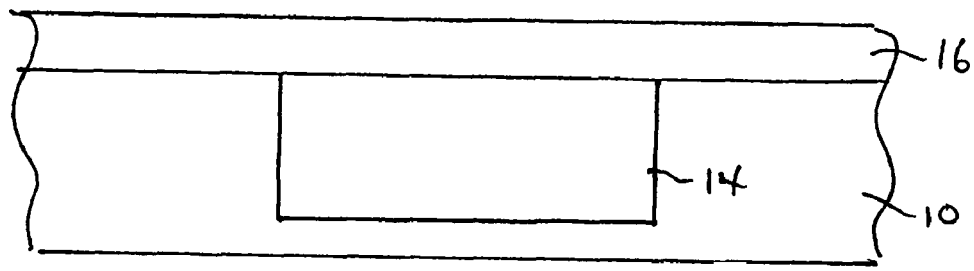
FIG. 2 shows the structure of FIG. 1 following the removal of a photoresist mask and formation of a hardmask, in accordance with embodiments of the present invention.

In FIG. 2, the initial photoresist layer 12 employed in doping the counterdoped region 14, has been removed and a hardmask 16 has been deposited over the doped substrate 10, including the counterdoped region 14. The hardmask 16 may be any suitable material, with a nitride being a preferred exemplary material. The hardmask 16 may be deposited by any conventional method, such as chemical vapor deposition (CVD).

Figure 3:
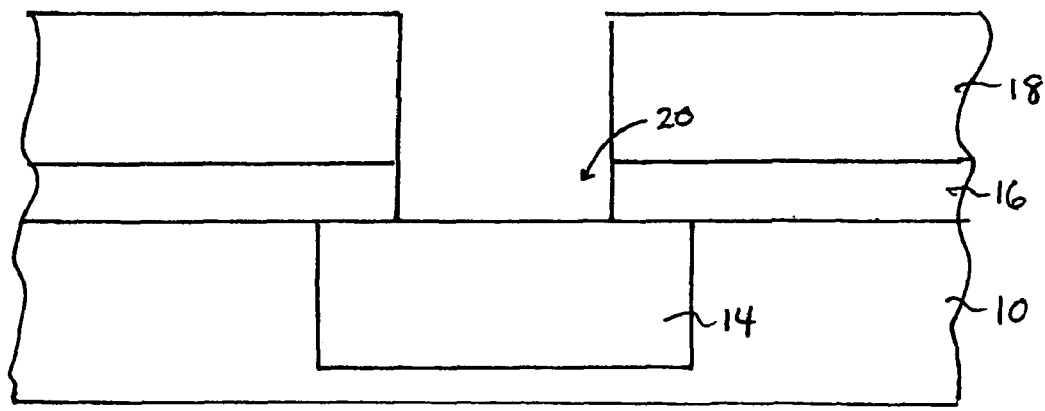
FIG. 3 depicts the structure of FIG. 2 following the patterning and etching of a hardmask, in accordance with embodiments of the present invention.

Turning to FIG. 3, a photoresist layer 18 has been deposited and patterned with the shape of the opening that will be etched in the hardmask 16. A suitable etchant chemistry is employed to etch through the hardmask 16 to create an opening 20 in the hardmask 16. A suitable etchant is one that is selective to etch the hardmask 16 and stop on the counterdoped region 14 of the doped substrate 10. When a nitride is employed as the hardmask 16, a suitable etchant chemistry is a mix of $CF_4/O_2$ or $SF_6/O_2$. The width of the opening 20 is substantially equal to the width of the recess that will subsequently be formed in the counterdoped region 14. However, this width of the opening 20 is more than the width of the local interconnect that will be formed at the bottom of the recess.

Figure 4:
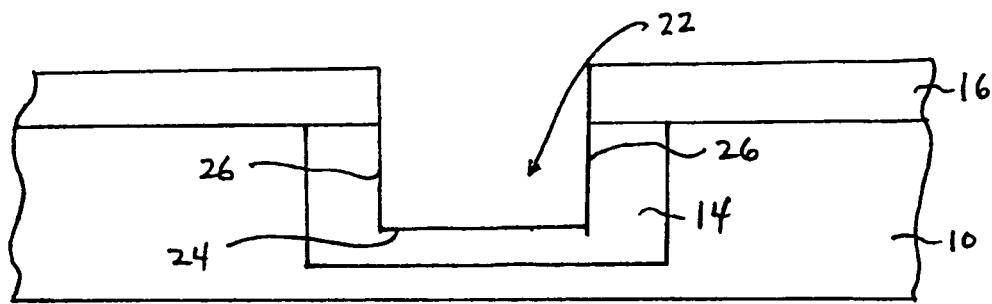
FIG. 4 shows the structure of FIG. 3 after a recess has been etched into a counterdoped region of the substrate, in accordance with embodiments of the present invention.

As shown in FIG. 4, once the opening 20 is formed in the hardmask 16, the photoresist 18 can then be removed and a recess 22 etched into the counterdoped region 14. The recess 22 includes sidewalls 26 and a bottom 24. Neither the sidewalls 26 nor the bottom 24 of the recess 22 reaches to the furthest extent of the counterdoped region 14. Thus, the counterdoped region 14 can properly serve its function to isolate the buried local interconnect from the remaining portion of the doped substrate 10. A timed etch is performed so that the bottom 24 of the recess 22 does not penetrate through the bottom of the counterdoped region 14 into the remaining portions of the doped substrate 10. Such timed etches are well known and readily controllable by those of ordinary skill in the art.

Figure 5:
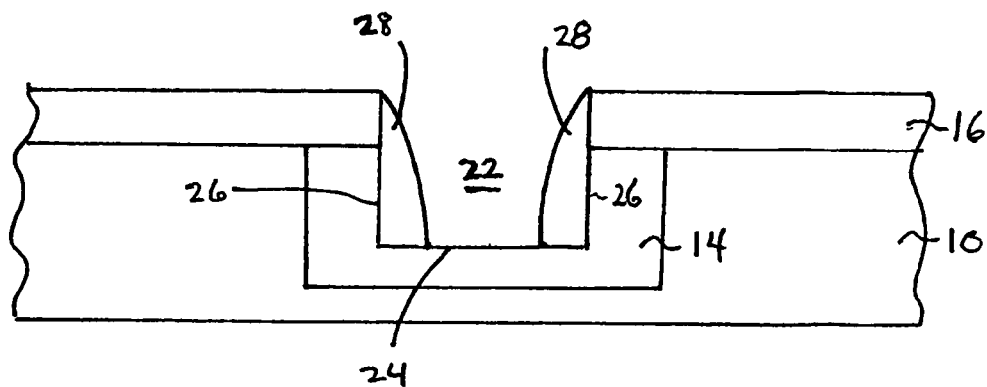
FIG. 5 depicts the structure of FIG. 4 after the deposition of dielectric material and the etching of the dielectric material to form dielectric spacers on the sidewalls of the recess, in accordance with embodiments of the present invention.

Following the formation of the recess 22, dielectric material is deposited in the recess 22 and on top of the hardmask 16. The dielectric material is then etched by anisotrophic etching, for example, to form dielectric spacers 28 on the sidewalls 26 of the recess 22. The anisotrophic etchant, such as reactive ion etchant, for example, exposes a portion of the bottom 24 of the recess 22. The formation of the dielectric spacers 28 is depicted in FIG. 5. The dielectric material deposited on the hardmask 16 is removed during the etching. The dielectric spacers 28 produce a narrower silicon surface 24 than would otherwise be provided by the bottom 24 of the entire recess 22.

Figure 6:
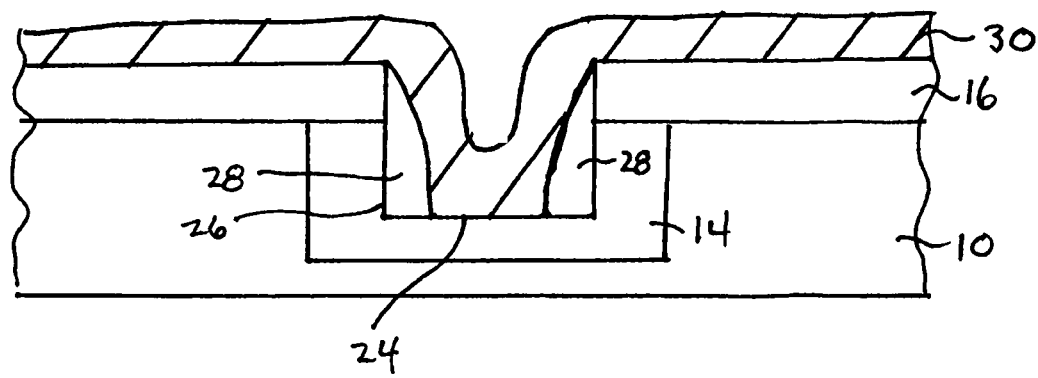
FIG. 6 shows the structure of FIG. 5 following the deposition of a metal in accordance with embodiments of the present invention.

FIG. 6 depicts the structure of FIG. 5 after a metal has been deposited by conventional methodologies within the recess and on the hardmask 16. The metal 30 may be any suitable material, such as, but not limited to, cobalt, titanium, nickel, tungsten, platinum, palladium, molybdenum, for example. The deposition may be by any conventional technique, including physical vapor deposition (PVD) or chemical vapor deposition (CVD), but is not limited to such deposition techniques.

The dielectric material in the dielectric spacers 28 may be any suitable material, although in preferred embodiments, the material is an oxide or a nitride.

Figure 7:
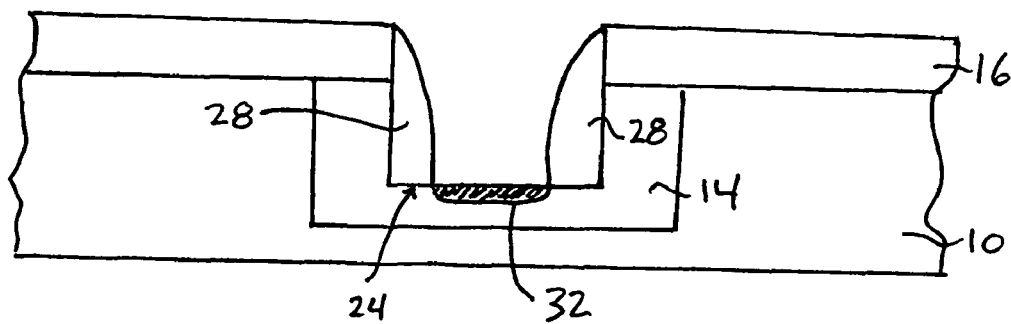
FIG. 7 shows the structure of FIG. 6 after the metal has been reacted with the substrate to form a silicide, and the unreacted metal has been stripped, in accordance with embodiments of the present invention.

Following the deposition of the metal 30, the metal 30 is reacted to form a silicide local interconnect line 32 at the bottom of the recess 24. This is depicted in FIG. 7, which also shows the unreacted metal having been stripped away by a suitable metal strip process. Since the only contact of the metal 30 with silicon is at the bottom 24 of the narrowed recess 22, the silicide only forms that the narrowed bottom 24 of the recess 22. The hardmask 16 prevents unwanted silicidation of the metal 30 with the doped substrate 10, and spacers 28 prevent unwanted silicidation on the sidewalls.

The reaction takes place in response to an annealing step performed in accordance with conventional techniques. For example, a rapid thermal annealing may be employed to react the metal 30 with the silicon in the counterdoped region 14. Suitable temperatures and annealing times may be employed in accordance with the specific metal that is used as the metal 30. Alternative techniques for reacting the metal 30 with the silicon of the counterdoped region 14 include laser thermal annealing (LTA), for example. Suitable parameters for employing laser thermal annealing may be selected by those of ordinary skill in the art, depending upon the particular metal used.

Figure 8:
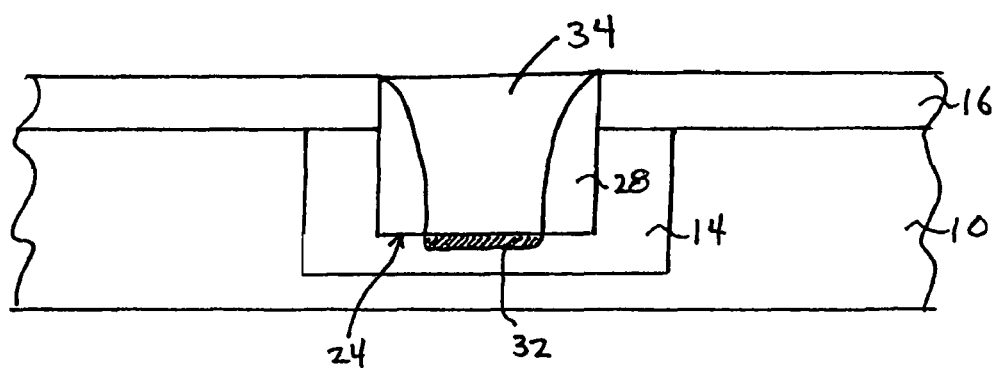
FIG. 8 depicts the structure of FIG. 7 following the deposition of fill material and the polishing of the fill material, in accordance with embodiments of the present invention.

FIG. 8 shows the structure of FIG. 7 after a fill material 34 has been deposited within the recess 22, over the local interconnect 32, and the fill material has been polished. The fill material 34 may be an oxide, in certain preferred embodiments of the invention. The deposition of the fill material 34 may be a conventional deposition. Polishing may be by chemical mechanical polishing, or other planarization technique, for example. Once the fill material 34 has been deposited within the recess 22, the local interconnect 32 may be considered a buried local interconnect 32, formed of silicide.

Figure 9:
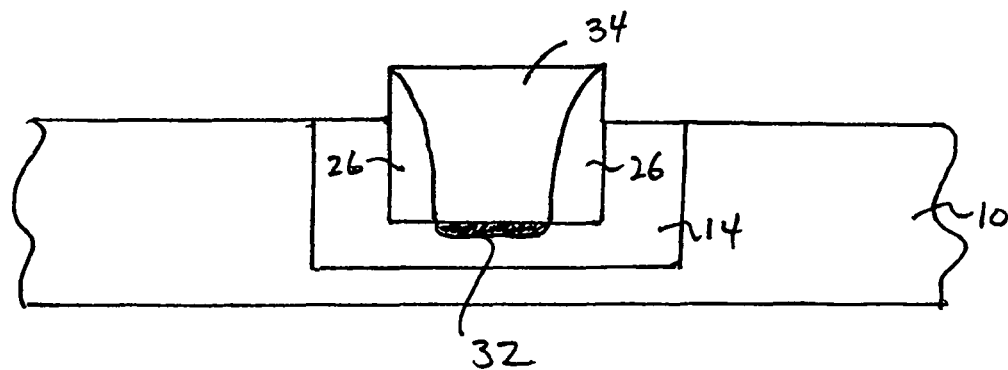
FIG. 9 shows the structure of FIG. 8 after the hardmask has been removed in accordance with embodiments of the present invention.

In FIG. 9, the hardmask 16 is shown as having been removed, such as by a conventional etching technique that selectively removes the hardmask 16 without etching the fill material 34. When the hardmask 16 is nitride and the fill material 34 is an oxide, for example, a suitable etching chemistry is a mix of $CF_4/O_2$ or $SF_6/O_2$. The final structure of the buried local interconnect is therefore depicted in FIG. 9.

The present invention thus provides a buried local interconnect made of silicide, exhibiting a low resistance, in the manner that produces a very narrow structure.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a buried local interconnect comprising the steps of:
    forming a hardmask on a substrate and patterning the hardmask to form a patterned hardmask;
    etching a recess having a bottom and sidewalls into the substrate through the patterned hardmask;
    forming sidewall spacers in the recess;
    forming silicide on the bottom of the recess by depositing a metal within the recess between the sidewall spacers, reacting the metal with the bottom of the recess and stripping away unreacted metal to thereby define the buried local interconnect;
    depositing fill material over the silicide; and
    removing the patterned hardmask after the fill material is deposited;
    wherein the sidewall spacers are sized such that the silicide formed on the bottom of the recess in a final structure of the buried local interconnect is narrower than the bottom of the recess.

2. The method of claim 1, wherein the metal includes at least one of: Co, Ti, Ni, W, Pt, Pd or Mo.

3. The method of claim 2, wherein the metal is reacted with the silicon by rapid thermal annealing.

4. The method of claim 2, wherein the metal is reacted with the silicon by laser thermal annealing.

5. The method of claim 1, wherein the substrate is a doped substrate, and further comprising forming a counterdoped region in the substrate.

6. The method of claim 5, wherein the recess is etched into the counterdoped region in the substrate.

7. The method of claim 1, wherein the hardmask is a nitride, the sidewall spacers are an oxide or a nitride, and the fill material is an oxide.

8. The method of claim 7, wherein the silicide comprises at least one of: cobalt silicide, titanium silicide, nickel silicide, tungsten silicide, platinum silicide, palladium silicide, or molybdenum silicide.

9. A method of forming a buried local interconnect, comprising the steps of:
    counterdoping a region of a doped substrate to form a counterdoped isolation region;
    forming and patterning a hardmask on the doped substrate;
    etching a recess through the patterned hardmask into the counterdoped region;
    forming dielectric spacers on sidewalls of the recess, a portion of a bottom of the recess being exposed;
    depositing a metal in the recess;
    reacting the metal in the recess to form silicide at the bottom of the recess and stripping unreacted metal to thereby define the buried local interconnect;
    filling the recess with fill material; and
    removing the hardmask;
    wherein the dielectric spacers are sized such that the silicide formed at the bottom of the recess in a final structure of the buried local interconnect is narrower than the bottom of the recess.

10. The method of claim 9, wherein the hardmask is a nitride, the dielectric spacers are an oxide or a nitride, and the fill material is an oxide.

11. The method of claim 10, wherein the silicide comprises at least one of cobalt silicide, titanium silicide, nickel silicide, tungsten silicide, platinum silicide, palladium silicide, or molybdenum silicide.

* * * * *

UNITED STATES PATENT AND TRADEMARK OFFICE
CERTIFICATE OF CORRECTION

PATENT NO. : 7,786,003 B1  Page 1 of 1
APPLICATION NO. : 11/136569
DATED : August 31, 2010
INVENTOR(S) : Arvind Halliyal et al.

It is certified that error appears in the above-identified patent and that said Letters Patent is hereby corrected as shown below:

IN THE CLAIMS

At claim 11, column 6, line 44, before "one of", insert --:--.

Signed and Sealed this

Thirtieth Day of November, 2010

David J. Kappos
*Director of the United States Patent and Trademark Office*